Figure 1:
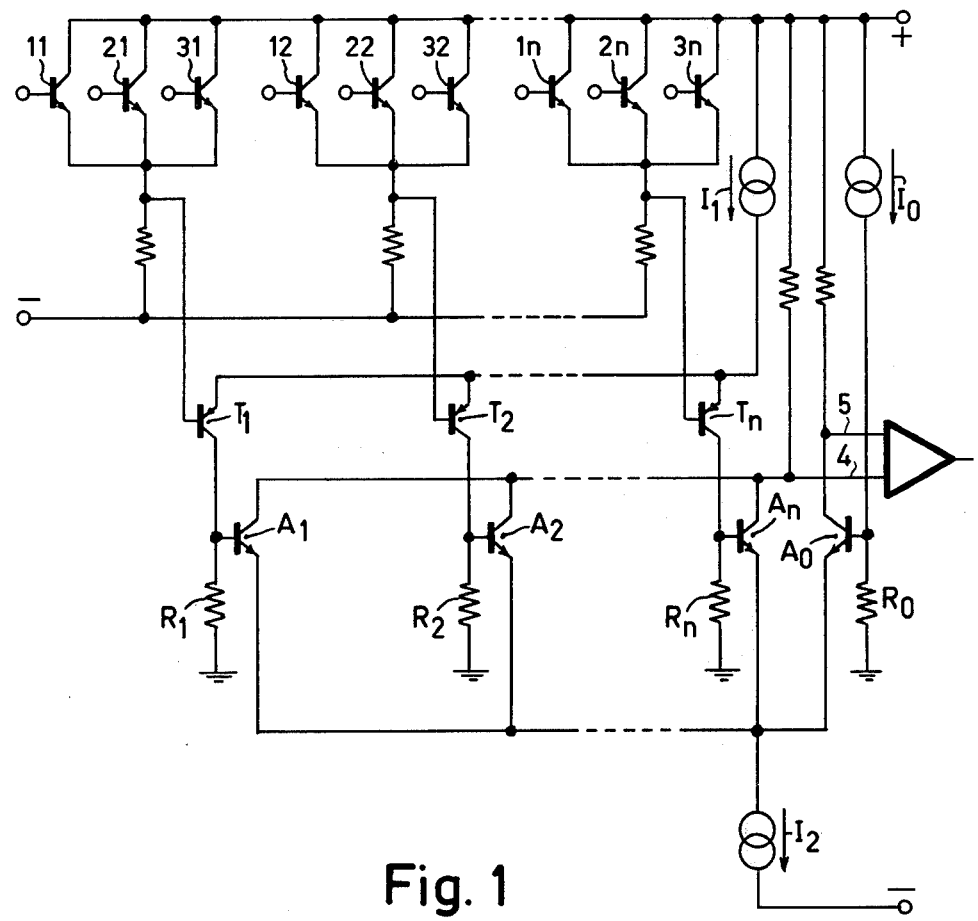

United States Patent [19]

Kuijk

[11] 4,020,364
[45] Apr. 26, 1977

[54] RESISTANCE READ AMPLIFIER

[75] Inventor: Karel Elbert Kuijk, Emmasingel, Netherlands

[73] Assignee: U.S. Philips Corporation, New York, N.Y.

[22] Filed: Sept. 15, 1975

[21] Appl. No.: 613,621

[30] Foreign Application Priority Data

Sept. 28, 1974  Netherlands ............... 7412870

[52] U.S. Cl. ..................... 307/242; 307/255
[51] Int. Cl.² ................................. H03K 17/60
[58] Field of Search ............... 307/241, 242, 255; 328/104–119; 330/30 D

[56] References Cited

UNITED STATES PATENTS

| | | | |
|---|---|---|---|
| 3,593,177 | 7/1971 | Tanaka | 307/242 |
| 3,593,178 | 7/1971 | Tanaka | 307/242 |
| 3,646,587 | 2/1972 | Shaffstall et al. | 307/205 |
| 3,764,818 | 10/1973 | Masuda et al. | 307/241 |

*Primary Examiner*—Stanley D. Miller, Jr.
*Assistant Examiner*—B. P. Davis
*Attorney, Agent, or Firm*—Frank R. Trifari; Bernard Franzblau

[57] ABSTRACT

Resistance read amplifier in which a resistor the resistance of which is to be determined is connected by an electronic selection switch to a constant-current source which at the same time switches an associated output amplifier into circuit.

10 Claims, 3 Drawing Figures

RESISTANCE READ AMPLIFIER

The invention relates to a circuit arrangement for determining at will the resistance of one resistor from a group of resistors, in particular magnetoresistors.

Such a circuit arrangement may be used, for example, for reading the information on a magnetic disk or tape store. The information is recorded in this store in the form of variable magnetisation varying the resistance of a magnetoresistor in a read head. The read head may comprise a plurality of magnetoresistors for reading at will any of a plurality of information tracks of the storage device.

It is an object of the present invention to select at will any one of the assembly of magnetoresistors in order to read the associated information track. Such selection in general takes place under the control of information which is stored in a store (which may be the same store and which, for simplicity of the following description, will be assumed to be given in the form of control voltages at the inputs of a one-out-of-$n$ decoding circuit). As a rule, the control voltages are given in the form of logic ones and zeros, the function of the one-out-of-$n$ decoding circuit being to energize only one of its outputs for each combination of said logic ones and zeros. By connecting the outputs of the decoding circuit to an (electronic) selection switch the latter thus establishes only one connection in accordance with the said logic combination.

It is an object of the invention to have the said electronic selection switch select at will one of the resistors and then to determine the resistance thereof. As a rule, a resistance is determined by passing an electric current through the resistors and measuring the voltage produced. Hence, accurate determination of the resistance requires an accurately determined current source. In integrated circuit technology it is possible to manufacture accurately equal current sources by using the current mirror principle. Hence each of the resistors the resistance of which is to be determined may have a separate current source associated with it, the selection switch being connected to the resistors so that the voltage across only one resistor at a time is applied to an output amplifier.

The invention provides a far more attractive solution and is characterized by the provision of a. a current source of high internal resistance b. a plurality of electronic switches, respectively associated with each of the resistors the resistance of which is to be determined, for selecting that one resistor from the group of resistors the resistance of which is to be determined c. an output amplifier d. a plurality of series circuits which each comprise the one resistor the resistance of which is to be determined, the electronic selection switch associated with it and the said current source common to all the series circuits, the arrangement being such that the selection switches cause the current from the current source to flow through the one (selected) resistor only while at the same time the voltage across this and no other resistor is transmitted to the output amplifier.

The steps according to the invention provide a circuit arrangement which is far more advantageous energetically since, not only are unnecessary currents flowing through the non-selected resistors dispensed with, but also owing to the selection all the current paths connected to the resistors the resistances of which are to be determined, in particular electronic switches following these resistors, with the exception of the one selected resistor, have no current supplied to them.

In a preferred embodiment of the invention concept the electronic selection switch comprises transistors of a conductivity type opposite to that of the transistors included in the output amplifier, the resistances to be determined being included in the base input circuits of the last-mentioned transistors. This embodiment yields several advantages, i.e. it requires a minimum number of transistors and thus occupies a small area of the semiconductor element of the integrated circuit, a good signal-to-noise ratio is guaranteed, even when the resistors and current sources used are afflicted with noise, the said last-mentioned transistors provide an extra gain contribution which also has a favourable effect on the signal-to-noise ratio, and the transistors of the selection switch are connected as current switches so that the current which flows through the resistances to be determined accurately corresponds to that of the said current source.

Figure 2:
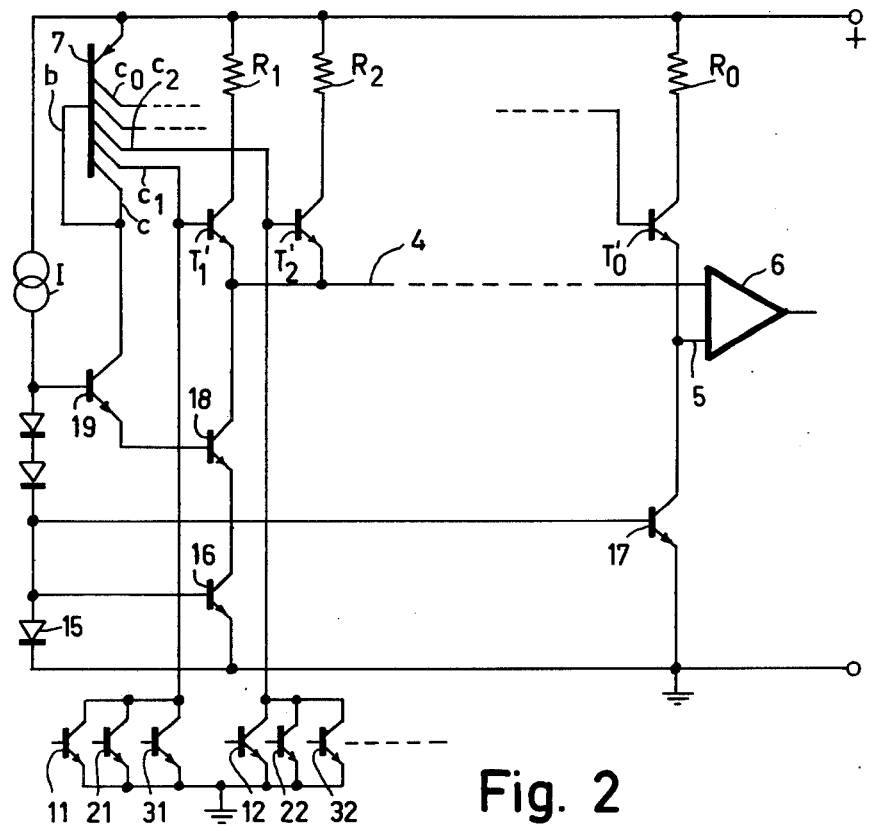
Figure 3:
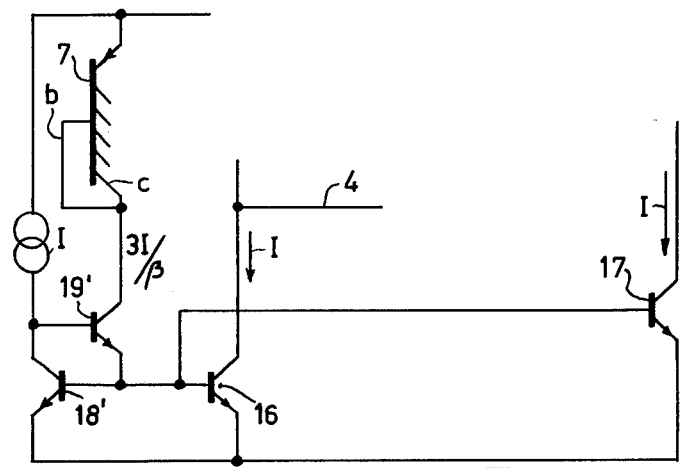

Embodiments of the invention will now be described, by way of example, with reference to the accompanying diagrammatic drawings, in which:

FIG. 1 shows a first embodiment of a circuit arrangement according to the invention, FIG. 2 shows a second embodiment of such a circuit arrangement, and FIG. 3 shows a modification of a detail of the circuit arrangement shown in FIG. 2, Referring now to FIG. 1, the circuit arrangement shown includes magnetoresistors $R_1$, $R_2$ .... $R_n$ the resistances of which are to be determined at will. The resistors are connected in the output circuits of an electronic selection switch comprising transistors $T_1$, $T_2$, ... $T_n$. The transistors are controlled by a decoding circuit comprising transistor gate circuits 11, 21, 31 connected to the transistor $T_1$; 12, 22, 32 connected to the transistor $T_2$; and 1$n$, 2$n$ and 3$n$ connected to the transistor $T_n$. To this decoding circuit, logic input voltages - in the embodiment shown three voltages - are applied. Each gate circuit composed of three transistors 11, 21, 31; 12, 22, 32; etc. has another logic input combination applied to it, for example, successively the combinations 1 1 1 ; 1 1 0 ; 1 0 1 ; 1 0 0 ; and so on, and hence in the embodiment shown altogether eight logic combinations ($n = 8$). It will be clear that under these conditions all the gate circuits 11, 21, 31; 12, 22, 32; and so on but one will pass current and hence all the transistors $T_1$ to $T_n$ but one will be cut off. Obviously the number of logic input voltages may be increased, in which case the number of gates and the number of transistors in each gate must accordingly be increased.

The transistors $T_1$ to $T_n$ are individually connected in series with the resistors $R_1$ to $R_n$ respectively the resistances of which are to be determined, and with a common current source $I_1$. The electronic selection switch $T_1$ to $T_n$ now causes the current from the source $I_1$ to flow through only one of the resistors $R_1$ to $R_n$ and at the same time only one of the amplifier elements $A_1$ to $A_n$ connected to these resistors drains current. The amplifier elements $A_1$ to $A_n$ also are transistors which are connected in series with a common current source $I_2$ to the voltage supply. The transistors 11, 21, 31; 12, 22, 32; etc. and the transistors $A_1$, $A_2$, .... $A_n$ are of one conductivity type, in the embodiment shown they are npn transistors. The transistors of the electronic selection switch $T_1$, $T_2$, ... $T_n$ are of the opposite conductivity type. A further current source $I_0$ is provided the current of which is supplied to a further resistor $R_0$, which also may be a magnetoresistor and is arranged near to the resistors $R_1$ to $R_n$ the resistances of which are to be measured. Although resistor $R_0$ is subjected to the same disturbing magnetic fields, it is substantially unaffected by the magnetic field information to be measured, and thus enables undesirable measuring errors to be compensated. For this purpose the voltage across the resistor $R_0$ is supplied to an amplifier $A_0$ which in conjunction with each of the amplifiers $A_1$ to $A_n$ forms a differential amplifier having output terminals 4 and 5. A current source $I_2$ is connected in the common emitter circuits of all the transistors $A_0$ to $A_n$. Normally the nominal values of the resistors $R_0$ to $R_n$ will be equal, in which case the current sources $I_0$ and $I_1$ must supply equal currents.

The circuit arrangement can be manufactured easily in integrated-circuit form, all the transistors 11 to $3n$ of the decoding circuit being constructed as vertical transistors in a common collector island. Similarly the transistors $A_0$ to $A_n$ also can be constructed as vertical transistors having a common collector island. The transistors $T_1$ to $T_n$ will normally be implemented by lateral transistors. This has the disadvantage that these transistors have a comparatively low collector-base current gain factor so that a small measuring error may occur because the difference between the current from the source $I_1$ and the current flowing through the resistors $R_1$ to $R_n$ to be measured can no longer be ignored.

FIG. 2 shows a modified embodiment in which the circuit arrangement, except for the current sources, can entirely be constructed with vertical transistors, i.e. $npn$ transistors.

Here too the resistors to be measured are designated by $R_1$, $R_2$, ... and the compensating transistor by $R_0$. The said resistors now are connected in the collector circuits of the transistors $T'_1$, $T'_2$, ... $T'_0$ which are in the form of vertical transistors, in the embodiment shown npn transistors. The transistors $T'_1$, $T'_2{}'$, ... here too are controlled by a one-out-of-$n$ decoding circuit which comprises transistor gate circuits 11, 21, 31; 12, 22, 32; and so on similar to the circuit arrangement shown in FIG. 1. The transistors $T'_1$, $T'_2{}'$, ... again act as the electronic selection switch as described in FIG. 1 with reference to the transistors $T_1$, $T_2$, etc. The transistor $T'_0$ does not form part of this electronic selection switch but has a fixed bias, as will be described hereinafter.

By means of a current source I and current mirrors comprising a diode 15 and transistors 16 and 17 respectively equal bias currents are generated in the collectors of the said transistors. Assuming for the time being that a transistor 18, the function of which will be described more fully hereinafter, is absent, selection of any one of the transistors $T'_1$, $T'_2$, etc. of the electronic selection switch will cause a connection to be established between one of the resistors $R_1$, $R_2$, etc. to be measured and the output lead 4, while the transistor $T'_0$ similarly establishes a connection between the compensating resistor $R_0$ and the output lead 5. By means of a differential amplifier 6 the difference between the voltage generated across one of the resistors $R_1$, $R_2$, ... and the voltage generated across the resistor $R_0$ is amplified.

Base current supply to the transistors $T'_1$, $T'_2$ etc. may in principle be effected by means of resistors connected to the supply line. In the embodiment shown these base bias currents are produced by means of a multiple current source comprising a transistor 7 of the lateral type - in the embodiment shown of the $pnp$ type - discrete collectors $c1$, $c2$, ... of which are connected to the bases of the transistors $T'_1$, $T'_2$, etc. respectively. The base bias currents which thus are supplied by the collectors of the transistors 7 have values such that the transistors $T'_1$, $T'_2$, etc. are operated substantially in current saturation. In order to compensate for any measuring error due to the residual voltage drop between the collector and the emitter of the selected transistor $T'_1$, $T'_2$, etc. the base of transistor $T'_0$ is similarly supplied with bias current by a collector $c_0$ of the transistor 7. If the said measuring error is negligible, the transistor $T'_0$ can obviously be dispensed with.

The bias current which the collectors $c_1$, $c_2$, ... of the transistor 7 must supply to the bases of the transistors $T'_1$, $T'_2$, ... respectively are closely related to the bias current of the current source I, for this current (or a current proportional to it) after being mirrored in the current mirror 15, 16 flows through the selected one of the transistors $T'_1$, $T'_2$, etc. The base current required to operate this transistor substantially in current saturation then is slightly larger than the collector emitter bias current of the selected transistor divided by the collector base current gain factor measured in linear operation of this transistor.

There are various possible ways of deriving the current adjustment of the transistor 7 from the bias current flowing through the selected transistor. In the embodiment shown the collector current of the transistor 16 first is passed through an auxiliary transistor 18 before reaching the output lead 4 and, assuming the transistor 18 in its linear range to have a collector-base current gain factor equal to that of the transistor $T'_1$, $T_2$, etc. of the electronic selection switch, the base circuit of the transistor 18 passes a current which is lower by a fixed percentage than the required current supplied by the collectors $c_1$, $c_2$, etc. For this purpose the base of the transistor 18 is connected via a level shifting transistor 19 (to permit a sufficient voltage swing on the output lead 4) to an auxiliary collector $c$ of the transistor 7 which is directly connected to the base $b$ of this transistor. By making the transistor 7 a lateral transistor and by making the collecting surface area of the collector $c$ smaller than that of the collectors $c_1$, $c_2$, etc. by the said percentage, the base currents supplied to the transistors $T'_1$, $T'_2$, etc. of the electronic selection switch are increased with respect to the base current flowing in the transistor 18 precisely in the ratio of the collecting areas of $c_1$ etc. to that of $c$.

Another possible way of setting this desired ratio is, for example, to connect a transistor in series with the current source I smilar to the transistor 18 and deriving the drive for the transistor 7 from the base current of the said transistor. A further alternative is to omit the circuit elements 15, 18 and 19 and to connect a current source directly between the interconnection of the electrodes $c$ and $b$ of the transistor 7 and the base of the transistor 16. In this case, however, a change in the current gain factor of the transistor 16 will also change the bias current flowing through the selected one of the transistors $R_1$, $R_2$, etc. to be measured.

An elegant modification is shown in FIG. 3 in which by means of (vertical) transistors 18' and 19' the current of the source I can be mirrored to form corresponding currents I through the transistors 16 and 17, while the transistor 19' supplies the common base currents $3I/\beta$ of the transistors 18', 16 and 17 (where $\beta$ represents the collector-base current gain factor of these transistors) to the electrodes $c - b$ of the (lateral transistor 7. In this embodiment the collecting area of the auxiliary collector $c$ of the transistor 7 must be made correspondingly greater than is described with reference to FIG. 2.

When the circuit arrangement is implemented by means of integrated-circuit techniques in which in general a vertical transistor is obtained by forming in the substrate an island of opposite conductivity type, within this island another island of the same conductivity type as the substrate, and within the latter island a third island of the opposite conductivity type again, which islands in this order will constitute the collector, the base and the emitter respectively of the relevant vertical transistor, it may be objected that if the transistors $T'_1$, $T'_2$, etc. were operated in current saturation in a degree such that the collector base region of such a transistor would be in the forward direction the substrate, the collector region and the base region would constitute a parasitic (pnp) transistor which would drain away part of the useful current. It is true that in such a configuration an excess of base current supplied by the collectors $c_1$, $c_2$, etc. of the transistor 7 will flow away. However, the relevant selected transistor $T'_1$, $T'_2$, etc. will just be biased so that this phenomenon is not deleterious but on the contrary is beneficial.

What is claimed is:

1. A circuit for determining at will the resistance of any one resistor of a group of resistors comprising, a current source having a high internal resistance, a plurality of electronic selection switches for selecting one resistor at a time from said group of resistors, output amplifier means coupled to said resistors, means connecting a first resistor in a first series circuit with a first selection switch, a second resistor in a second series circuit with a second selection switch, and so on, and with said series circuits connected in parallel, means connecting said current source in common to all of said series circuits, and means or operating said selection switches so that the switches cause a current from the current source to flow through one selected resistor only and simultaneously applies to the output amplifier means the voltage developed across the selected resistor and no other resistor.

2. A circuit as claimed in claim 1 wherein the output amplifier means includes a plurality of transistors and the electronic selection switches include transistors of a conductivity type opposite to that of the transistors included in the output amplifier means, and means individually connecting the resistors in base input circuits of the output amplifier transistors.

3. A circuit as claimed in claim 1 characterized in that the output amplifier means and the selection switches include transistors of the same conductivity type, the resistors being connected in the collector circuits of the transistors of the selection switches.

4. A circuit as claimed in claim 3, characterized in that the base currents of the transistors of the selection switches are supplied by a transistor of the opposite conductivity type the current bias of which is derived from a current source which supplies the emitter currents of the transistors of the selection switches.

5. A circuit as claimed in claim 1 further comprising a current mirror circuit having an input terminal coupled to said current source, an output terminal coupled in common to said selection switches, and a common terminal connected to a point of reference potential.

6. A switching circuit comprising, a plurality of N resistors, a source of constant current, a plurality of N selection switches respectively associated with said plurality of N resistors, a plurality of N output transistor amplifiers individually coupled to said N resistors, means connecting said N resistors in N series circuits with said N selection switches, means connecting said N series circuits in parallel, means connecting said constant current source in common to all of said N series circuits so that the current source forms N individual further series circuits with said N series circuits, and means for operating said selection switches so that a current flows from the current source through only one selected resistor at a time and thereby simultaneously applies the voltage developed across the selected resistor to its associated coupled output transistor amplifier.

7. A switching circuit as claimed in claim 6 wherein each of the selection switches comprises a transistor with its main current path in series with its associated resistor and each resistor is directly connected to the base electrode of its individually coupled output transistor amplifier, and said switch operating means comprises a digital decoding circuit coupled to the base electrodes of the transistor selection switches.

8. A switching circuit as claimed in claim 6 wherein said resistors comprise magnetoresistors.

9. A switching circuit as claimed in claim 6 wherein said switch operating means is arranged to close said selection switches in mutually exclusive time periods whereby a current flows from said current source to only one resistor at a time, said resistors being directly coupled to the control electrodes of the output transistors so that the voltage developed across a selected resistor due to said current flow drives its associated output transistor into conduction while the remaining output transistors are all biased into cut-off.

10. A switching circuit as claimed in claim 6 wherein each of the selection switches comprises a transistor with its main current path in series with its asociated resistor and its control electrode coupled to the switch operating means, and a current mirror circuit having an input terminal coupled to said current source, an output terminal coupled in common to the main current paths of the selection switch transistors, and a common terminal connected to a point of reference potential.

* * * * *

UNITED STATES PATENT AND TRADEMARK OFFICE
CERTIFICATE OF CORRECTION

PATENT NO. : 4,020,364
DATED : April 26, 1977
INVENTOR(S) : KAREL ELBERT KUIJK

It is certified that error appears in the above-identified patent and that said Letters Patent are hereby corrected as shown below:

Col. 2, line 5, "invention" should be --inventive--;

Col. 5, line 4, "3I/" should be --3I/$\beta$--.

Signed and Sealed this

Twenty-second Day of November 1977

[SEAL]

Attest:

RUTH C. MASON
*Attesting Officer*

LUTRELLE F. PARKER
*Acting Commissioner of Patents and Trademarks*